United States Patent [19]

Forehand et al.

[11] Patent Number: 5,710,063

[45] Date of Patent: Jan. 20, 1998

[54] METHOD FOR IMPROVING THE ALIGNMENT OF HOLES WITH OTHER ELEMENTS ON A PRINTED CIRCUIT BOARD

[75] Inventors: Douglas W. Forehand, Mountain View; Karl A. Sauter, Pleasanton, both of Calif.

[73] Assignee: Sun Microsystems, Inc., Palo Alto, Calif.

[21] Appl. No.: 660,091

[22] Filed: Jun. 6, 1996

[51] Int. Cl.⁶ .................. H05K 3/30; H01L 21/18
[52] U.S. Cl. .............. 437/208; 437/8; 257/797; 361/764; 29/831; 29/833; 29/837
[58] Field of Search ................ 29/831, 833, 837, 29/846, 852; 361/764, 783; 257/797; 437/8, 208

[56] References Cited

U.S. PATENT DOCUMENTS

| | | | |
|---|---|---|---|
| Re. 32,910 | 4/1989 | Stuckler | 29/833 |
| 4,521,262 | 6/1985 | Pellegrino | 29/852 |
| 4,631,100 | 12/1986 | Pellegrino | 29/847 |
| 4,642,160 | 2/1987 | Burgess | 29/852 |
| 4,804,615 | 2/1989 | Larson et al. | 430/314 |
| 5,468,996 | 11/1995 | Chan et al. | 257/723 |
| 5,523,920 | 6/1996 | Machuga et al. | 257/778 |
| 5,545,308 | 8/1996 | Murphy et al. | 205/125 |

*Primary Examiner*—John Niebling
*Assistant Examiner*—Kevin F. Turner
*Attorney, Agent, or Firm*—Skjerven, Morrill, MacPherson, Franklin & Friel; Forrest E. Gunnison; E. Eric Hoffman

[57] ABSTRACT

A method of locating a socket on a printed circuit board which includes the steps of fabricating a plurality of pads and one or more fiducials on the upper surface of the printed circuit board, optically aligning a drill with the fiducial, and then drilling a socket hole through the printed circuit board at the location defined by the fiducial. A peg of the socket is inserted into the socket hole to align the socket with the printed circuit board. Alternatively, a method for locating holes on a printed circuit board includes the steps of forming a master tooling hole through the printed circuit board, locating a fiducial on the printed circuit board using the master tooling hole as a guide, focusing on the fiducial with an optically alignable drill, thereby aligning the drill, and then drilling a hole through the printed circuit board using the aligned drill. The fiducial is selected to be a material which provides a sharp optical contrast with the area surrounding the fiducial, thereby allowing the drill to be easily and accurately focused on the fiducial.

16 Claims, 11 Drawing Sheets

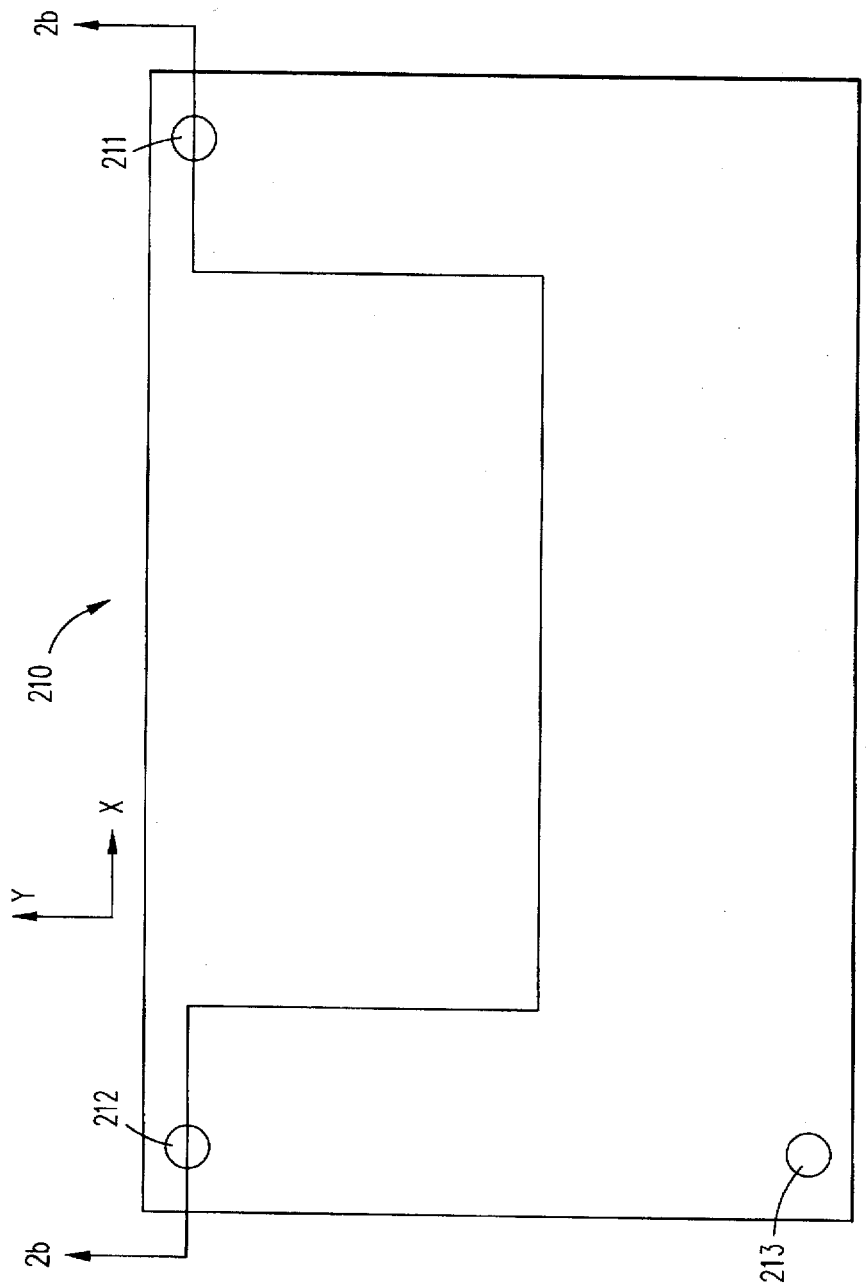
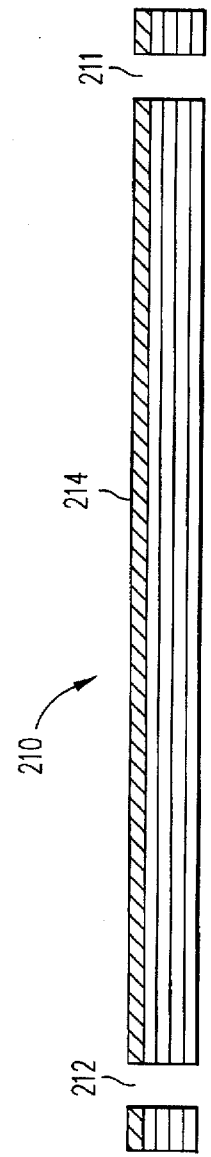
FIG. 2a
FIG. 2b

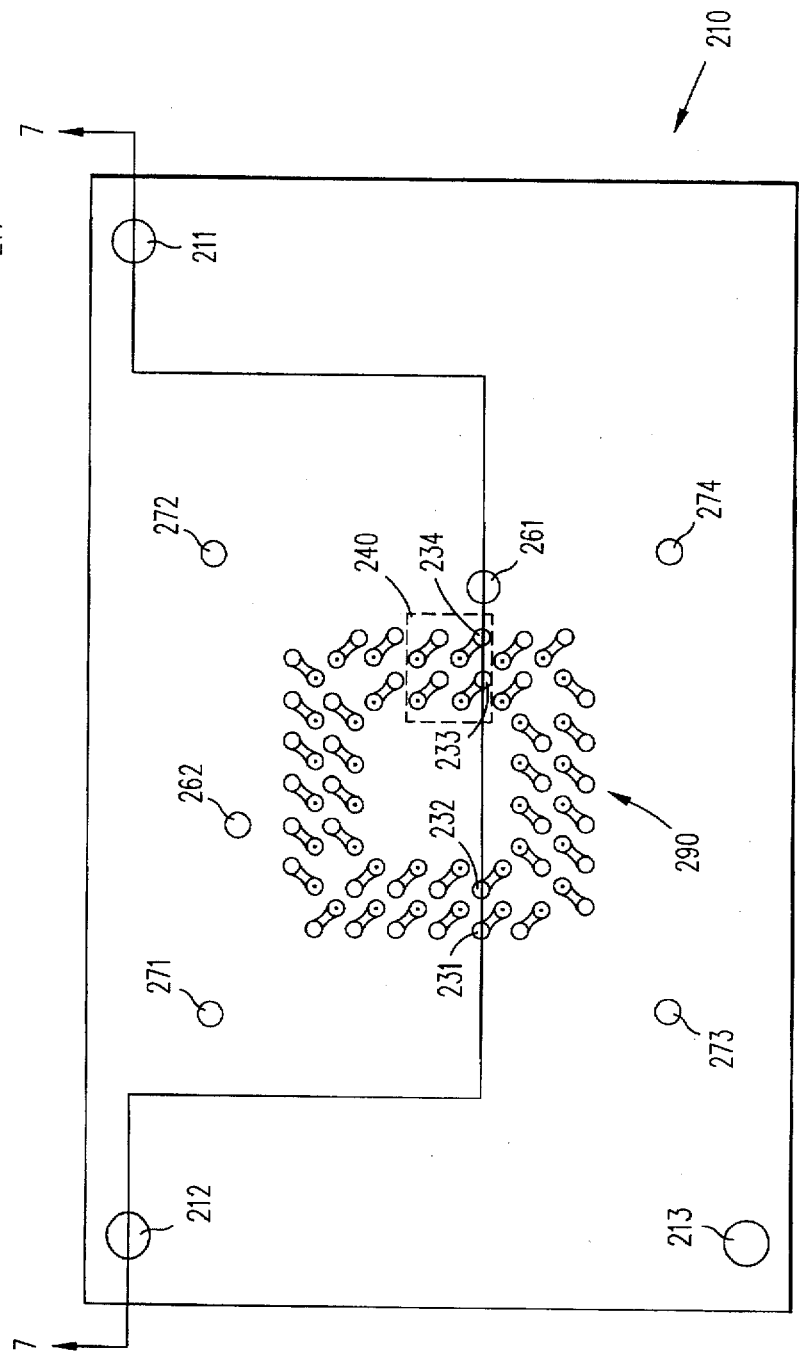

METHOD FOR IMPROVING THE ALIGNMENT OF HOLES WITH OTHER ELEMENTS ON A PRINTED CIRCUIT BOARD

BACKGROUND OF THE INVENTION

1. Field of Invention

The present invention relates to a method of locating holes on a printed circuit board. More specifically, the present invention relates to a method of improving the alignment of holes formed through a printed circuit board with other elements, such as pads, which are located on the printed circuit board.

2. Description of Related Art

FIG. 1 is a cross sectional view of a conventional electronic assembly 100. Electronic assembly 100 includes a multi-layer printed circuit board (PCB) 101, a socket 110, and an integrated circuit chip 120. Several holes are formed through PCB 101, including master tooling hole 103 and socket peg holes 104 and 105. A plurality of pads, such as pad 102, are located on the upper surface of PCB 101. These pads are generally circular and have a radius, R. These pads have a center-to-center spacing, or pitch, P.

A plurality of chamfered openings, such as opening 115, extend through socket 110. Fuzz buttons, such as fuzz button 113, are located in these chamfered openings. Socket pegs 111 and 112 extend from the underside of socket 110 for mating with corresponding socket peg holes 104 and 105. When socket pegs 111 and 112 are inserted in socket peg holes 104 and 105, each fuzz button should contact a corresponding pad on the upper surface of PCB 101. The radius of each fuzz button at the lower surface of socket 110 is limited by the chamfer radius $C_R$ of each chamfered opening at the lower surface of socket 110.

Integrated circuit chip 120 includes a plurality of pads, such as pad 121, on its lower surface. Chip 120 is mounted on socket 110 such that these pads contact corresponding fuzz buttons in socket 110. Socket 110 thereby facilitates the interconnection of IC chip 120 to PCB 101.

PCB 101 is fabricated as follows. Master tooling hole 103 is drilled near an edge of PCB 101 using a conventional numerically controlled drill. Using the master tooling hole 103 as a reference point, the drill is mechanically translated predetermined distances along X and Y axes to reach the locations corresponding to spacer peg holes 104 and 105. Holes 104 and 105 are then drilled. Because of the relatively long distances between master tooling hole 103 and socket peg holes 104 and 105, a relatively large tolerance exists in the location of holes 104 and 105 with respect to master tooling hole 103. This tolerance, $T_{PEG\ HOLE}$, is approximately +/−2 mils.

The pads located on the upper surface of PCB 101 are typically formed by plating a copper pattern on the upper surface of PCB 101. The copper pattern is defined by a reticle or photo-imaging pattern (artwork) which is aligned with master tooling hole 103. Again, because of the relatively long distances between master tooling hole 103 and the pads formed on the upper surface of PCB 101, a relatively large tolerance, $T_{PAD}$, exists in the location of these pads with respect to master tooling hole 103. This tolerance, $T_{PAD}$, is approximately +/−2 mils. Tolerances $T_{PAD}$ and $T_{PEG\ HOLE}$ are cumulative with respect to the tolerance between the location of the pads and the location of the peg holes 104–105. Consequently, the tolerance between the location of the pads with respect to the location of the peg holes, $T_{PAD-PEG\ HOLE}$, is approximately +/−4 mils.

Socket pegs 111 and 112 can also experience a center-to-center misalignment within socket peg holes 104 and 105. The tolerance of this misalignment, $T_{SH}$, is approximately +/−0.5 mils.

In addition, the location of the center of any fuzz button relative to socket pegs 111 and 112 has a tolerance, $T_S$, of approximately +/−1.5 mils.

The previously described tolerances must be taken into account when determining the chamfer radius $C_R$ of the holes through socket 110. The chamfer radius $C_R$ must be selected such that when socket 110 is connected to PCB 101, each fuzz button contacts its corresponding desired pad on PCB 101, with a minimum air gap, AG, between each fuzz button and its nearest neighboring pad. The minimum air gap is typically 1 mil. The formula below defines the maximum chamfer radius.

$$C_R = P - R - AG - T_{PAD-PEG\ HOLE} - T_{SH} - T_S$$

where each of the formula terms has been previously described.

It is desirable to minimize the factor (P–R) in the above equation. Minimizing (P–R) means that the packing density of the pads on PCB 101 is increased. That is, for a given pad radius, R, the pitch, P, is minimized. Viewed in another way, minimizing (P–R), means that the pad radius R is maximized for a given pitch P.

However, as (P–R) becomes smaller, the maximum allowable chamfer radius $C_R$ also becomes smaller. For example, if (P–R) becomes smaller than 17 mils, $C_R$ becomes less than 10 mils (i.e., 17–1–4–0.5–1.5). The smallest fuzz buttons typically have a radius of approximately 10 mils. Thus, when (P–R) becomes smaller than 17 mils, fuzz buttons can no longer be used to provide a reliable connection to the pads of PCB 101.

It would therefore be desirable to have a method for reducing $T_{PAD-PEG\ HOLE}$. By reducing $T_{PAD-PEG\ HOLE}$, (P–R) can be reduced by a similar amount, without reducing $C_R$ of the fuzz buttons. Alternatively, by reducing $T_{PAD-PEG\ HOLE}$, $C_R$ can be increased by a similar amount, without increasing (P–R).

SUMMARY OF THE INVENTION

Accordingly, the present invention provides a method for reducing the tolerance of the pad location relative to the socket peg hole location on the printed circuit board. That is, the present invention reduces $T_{PAD-PEG\ HOLE}$. As a result, the alignment between the socket and the pads on the printed circuit board is improved. This improved alignment advantageously allows the reliable use of larger fuzz buttons in the socket. Alternatively, this improved alignment advantageously allows for an increased pad packing density (i.e., a smaller (P–R)).

In accordance with one embodiment of the invention, the method includes the steps of (1) fabricating a plurality of pads and one or more fiducials on the upper surface of the printed circuit board, (2) optically aligning a drill with a fiducial, and then (3) drilling a socket hole through the printed circuit board at the location defined by the fiducial. A peg of the socket is inserted into the socket hole to align the socket with the printed circuit board.

The pads and fiducials can be fabricated at the same time over the upper surface of the printed circuit board. A master tooling hole is formed through the printed circuit board, and a plating resist (photoresist) is formed over the upper surface of the printed circuit board. The plating resist is selectively exposed using a reticle (artwork) which is aligned with the master tooling hole. The reticle defines the locations of the pads and fiducials. The exposed plating resist is developed, and the remaining areas which are not covered by plating resist are plated to form conductive features. The plating resist and the portions of the conductive layer which are not covered by the conductive features are removed, thereby forming the pads and socket peg fiducials at the desired locations. In this embodiment, $T_{PAD-PEG\ HOLE}$ is defined by the feature-to-feature tolerance of the photolithographic process used to form the pads and the socket peg fiducials and the tolerance of the optically aligned drill in creating the socket peg holes relative to the socket peg fiducials. These tolerances are much less (typically less than half) than the tolerances which define $T_{PAD-PEG\ HOLE}$ in prior art methods. As a result, $T_{PAD-PEG\ HOLE}$ is greatly reduced when compared with prior art methods.

The present invention can be extended to a method for locating any type of hole on a printed circuit board. This method includes the steps of (1) forming a master tooling hole through the printed circuit board, (2) locating a fiducial on the printed circuit board using the master tooling hole as a guide, (3) focusing on the fiducial with an optically alignable drill, thereby aligning the drill, and then (4) drilling a hole through the printed circuit board using the aligned drill. The fiducial is selected to be a material which provides a sharp optical contrast with the area surrounding the fiducial, thereby allowing the drill to be easily and accurately focused on the fiducial.

The present invention will be more fully understood in light of the following detailed description taken together with the drawings.

BRIEF DESCRIPTION OF THE DRAWINGS

FIG. 2a is a top view of a multi-layer printed circuit board;

FIG. 2b is a cross sectional view of the multi-layer printed circuit board along section line 2b–2b of FIG. 2a;

FIGS. 3, 4, 5, 6 and 7 are cross sectional views along section line 2b–2b of FIG. 2a which illustrate steps used to process the upper layer of the printed circuit board of FIGS. 2a and 2b;

FIG. 8 is a top view of the printed circuit board illustrated in FIG. 7;

DETAILED DESCRIPTION

FIGS. 2a and 2b are top and cross sectional views, respectively, of a multi-layer printed circuit board (PCB) 210. PCB 210 is a conventional element which includes alternating electrically conductive and electrically insulating layers. Each of the conductive layers is patterned to provide the desired electrical connections within PCB 210. Vias (not shown) extend through the insulating layers of PCB 210. Conductive material is located in these vias, thereby providing electrical connections between the various conductive layers. A conductive layer 214 is exposed at the upper surface of PCB 210. In a particular embodiment, this conductive layer 214 is a thin layer of copper foil, although other materials are possible.

Master tooling hole 211 is formed at a predetermined location on PCB 210, typically near a corner of PCB 210. Master tooling hole 211, which extends through PCB 210, can be formed, for example, by a numerically controlled drill. This drill may use lamination tooling holes, x-ray optimization, spot-facing of targets on inner layers of PCB 101 or other means as reference to locate master tooling hole 211. Tooling holes 212 and 213 are then formed at predetermined locations on PCB 210 with respect to master tooling hole 211. To accomplish this, the numerically controlled drill is moved from master tooling hole 211 predetermined distances along the X and Y axes of PCB 210. Tooling holes 212 and 213 are typically located near other corners of PCB 210. As described in more detail below, master tooling hole 211 (and tooling holes 212–213.) are used for alignment and registration of a reticle (artwork) which is used to pattern various layers over the upper surface of PCB 210.

Figure 1:
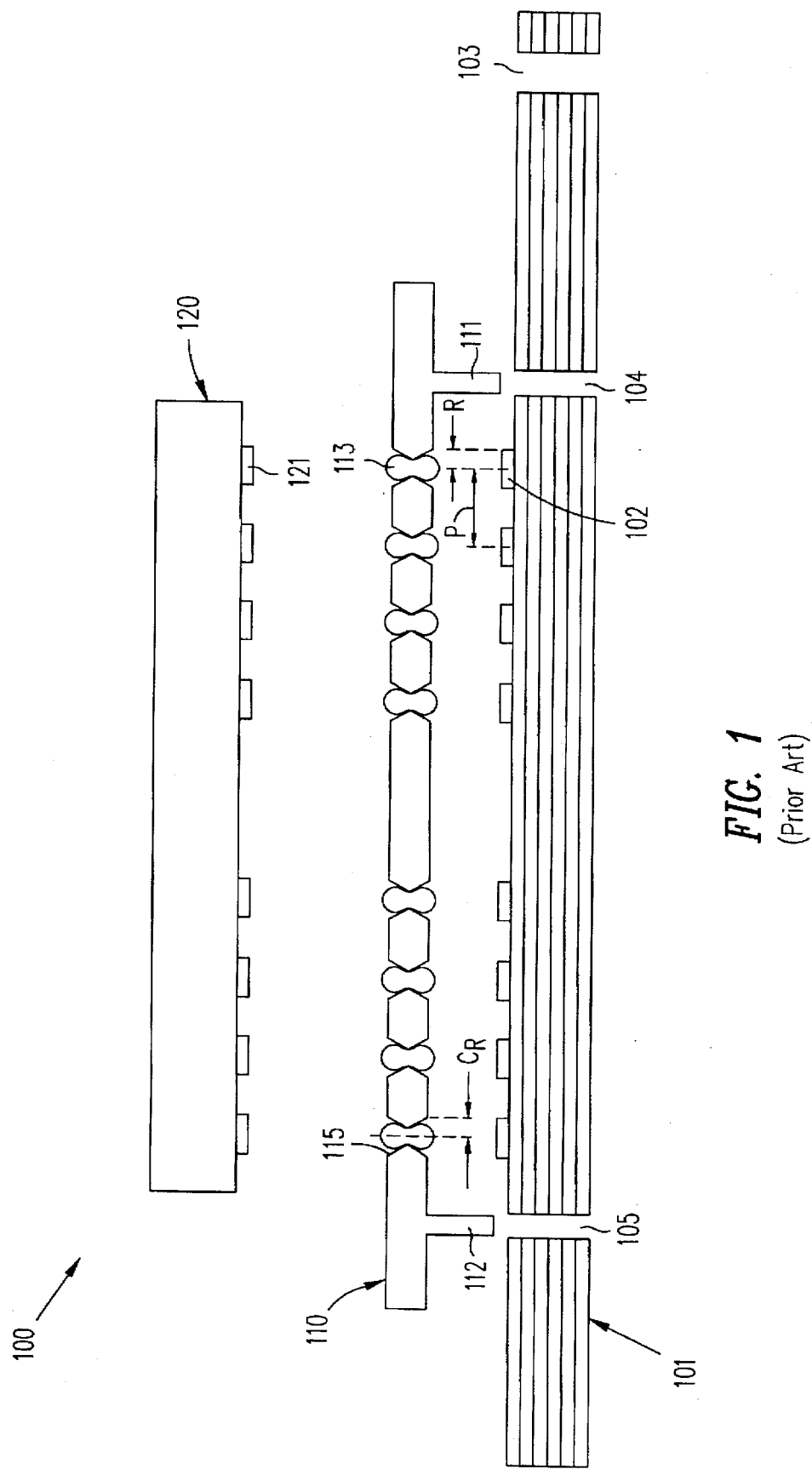
FIG. 1 is a cross sectional view of a conventional electronic assembly.
Figure 3:
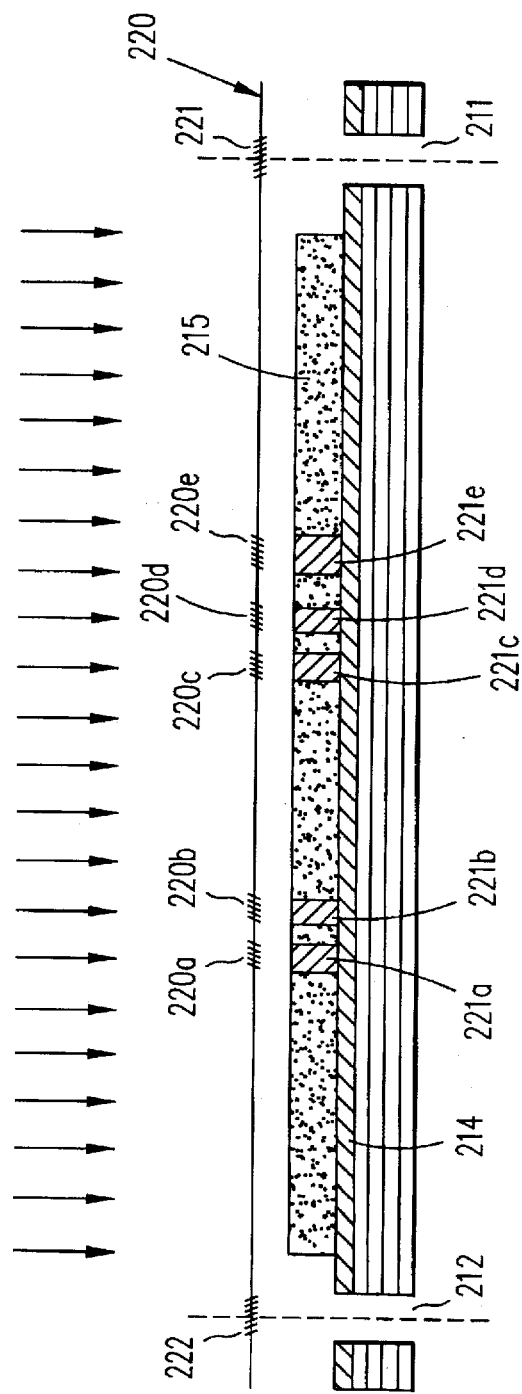

FIGS. 3, 4, 5, 6 and 7 are cross sectional views along section line 2b–2b of FIG. 2a, which illustrates processing steps used to form pads and fiducials on the upper surface of PCB 210 in accordance with one embodiment of the invention. As illustrated in FIG. 3, a plating resist (photoresist) layer 215 is deposited over the upper surface of conductive layer 214. A reticle 220 is aligned with tooling holes 211–213 on PCB 210. Reticle 220 includes features 221 and 222 which are aligned with tooling holes 211 and 212, respectively. Features 221 and 222 can be optical markings located on reticle 220. In this embodiment, features 221 and 222 are optically aligned with tooling holes 211 and 212, thereby aligning reticle 220 with PCB 210. Alternatively, features 221 and 222 can be openings through reticle 220. In this embodiment, pins are located through tooling holes 211 and 212 and corresponding features 221 and 222, thereby aligning reticle 220 with PCB 210.

Reticle (artwork) 220 further includes optically clear areas (images) through which light passes to cure/harden selected areas of photoresist layer 215. Reticle 220 also includes optically opaque areas 220a–220d, which define the locations of button pads which will subsequently be plated on conductive layer 214. In addition, reticle 220 includes an optically opaque area 220e, which defines the location of a fiducial which will subsequently be plated on conductive layer 214.

Figure 4:
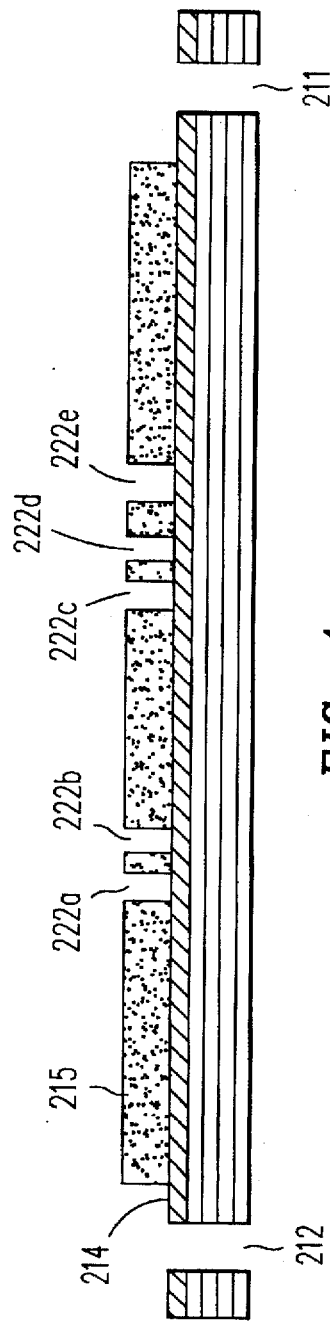

Photoresist layer 215 is exposed through reticle 220, such that regions 221a–221e of photoresist layer 215 remain uncured. Photoresist layer 215 is then developed such that uncured photoresist regions 221a–221e are removed, while the remaining portions of photoresist layer 215 remain on conductive layer 214. The resulting structure, which includes openings 222a–222e, is illustrated in FIG. 4. Although the present invention is described in connection with a negative photoresist, in other embodiments, a positive photoresist can be used to obtain similar results.

Figure 5:
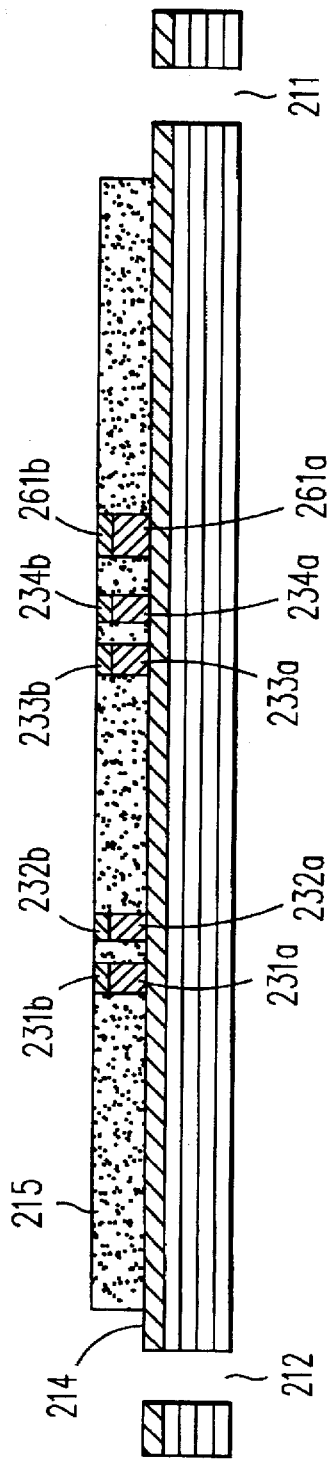

After photoresist layer 215 is developed, portions of conductive layer 214 are exposed through openings 222a–222e. An electrically conductive material, such as copper, is plated in openings 222a–222e, thereby forming conductive features 231a, 232a, 233a, 234a and 261a (FIG. 5). A thin layer of etch resist, such as nickel-gold, is plated over first conductive features 231a, 232a, 233a, 234a and 261a, thereby forming etch resist features 231b, 232b, 233b, 234b and 261b as illustrated in FIG. 5.

Figure 6:
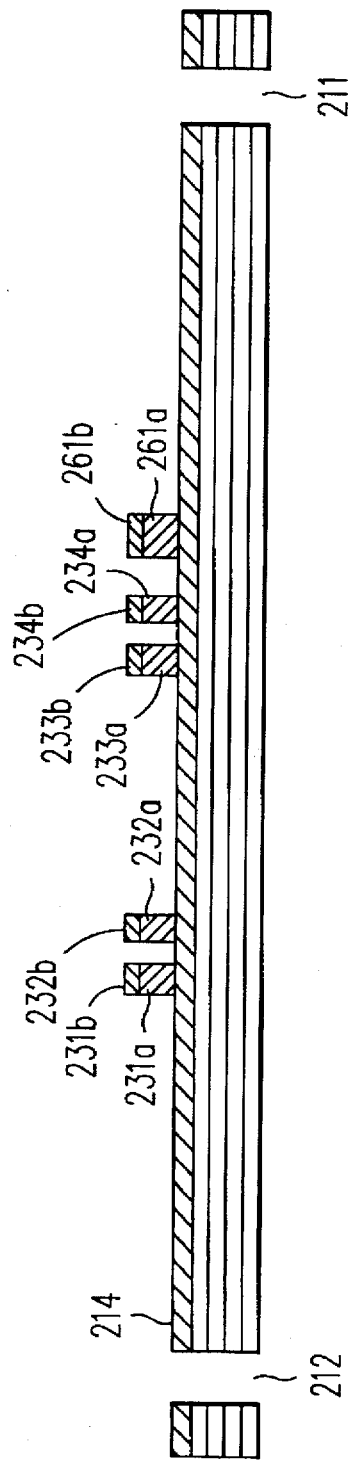

After etch resist features 231b, 232b, 233b, 234b and 261b have been formed, photoresist layer 215 is removed using a conventional stripping process (FIG. 6). An etch is then performed to remove the portions of conductive layer 214 which are not covered by conductive features 231a, 232a, 233a, 234a and 261a and etch resist features 231b, 232b, 233b, 234b and 261b. The exposed portions of conductive layer 214 are thin, such that these exposed portions are quickly and easily removed by the etchant. Etch resist features 231b, 232b, 233b, 234b and 261b prevent corresponding conductive features 231a, 232a, 233a, 234a and 261a from being etched. Portions 231c, 232c, 233c, 234c and 261c of conductive layer 214 remain under corresponding conductive features 231a, 232a, 233a, 234a and 261a. The resulting structure is shown in FIG. 7. FIGS. 3–7 greatly exaggerate the dimensions of the various layers for purposes of illustration.

As illustrated in FIG. 7, conductive features 231a, 232a, 233a, 234a and 261a, etch resist features 231b, 232b, 233b, 234b and 261b, and portions 231c, 232c, 233c, 234c and 261c of conductive layer 214 form button pads 231, 232, 233 and 234 and fiducial 261.

FIG. 8 is a top view of the resulting PCB 210. (FIG. 7 is a cross sectional view along section line 7—7 of FIG. 8.) As shown in FIG. 8, the pattern of reticle 220 results in the formation of an array 290 of button pads, via pads, and connector strips.

Figure 9:
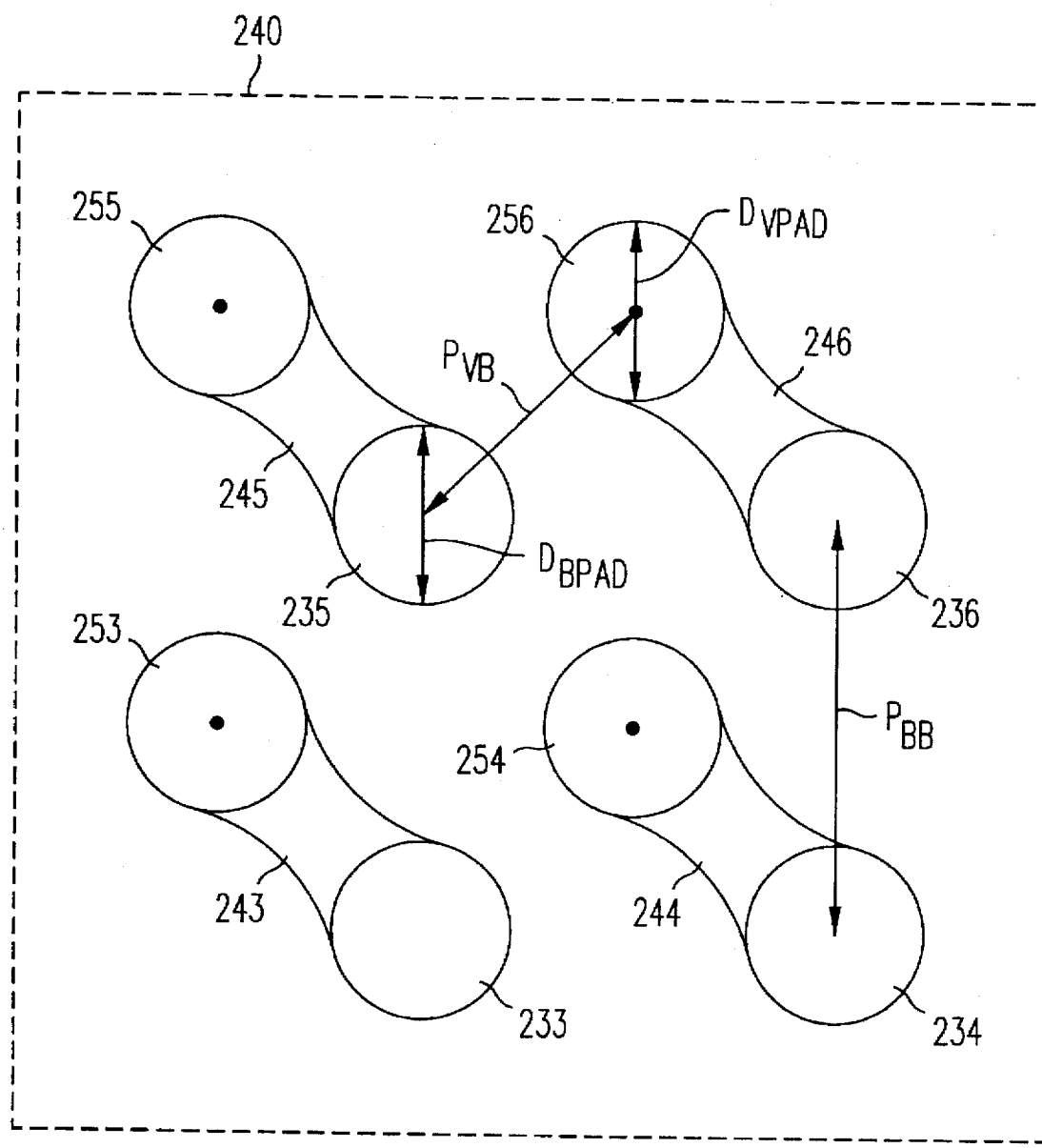
FIG. 9 is a close up view of a region of the printed circuit board of FIG. 8.

FIG. 9 is a close up view of region 240 of array 290. Region 240 includes button pads 233–236, connector strips 243–246 and via pads 253–256. Each of button pads 233–236 is coupled to a corresponding via pad 253–256 by a corresponding connector strip 243–246. Each via pad 253–256, shown as a circle with a dot, connects to an electrically conductive via plug which extends through an insulating layer of PCB 210, thereby providing a connection to the conductive layers within PCB 210. In the described embodiment, each of button pads 233–236 has a diameter $D_{BPAD}$ of approximately 22 mils, and each of via pads 253–256 has a diameter $D_{VPAD}$ of approximately 22 mils. The center-to-center pitch between adjacent button pads and via pads, $P_{VB}$, is approximately 27.8 mils. The center-to-center pitch between adjacent button pads, $P_{BB}$, is approximately 40 mils. Thus, the critical pitch is the pitch $P_{VB}$ between adjacent button pads and via pads.

Returning now to FIG. 8, the pattern of reticle 220 also creates a second socket peg fiducial 262 and four optional heat sink fiducials 271–274. Each of fiducials 261–262 and 271–274 is approximately 40 mils in diameter. In the described embodiment, a nickel-gold plating process forms a layer over the upper surfaces of socket peg fiducials 261–262, heat sink fiducials 271–274, and the button pads, via pads and connector strips of array 290.

Figure 10:
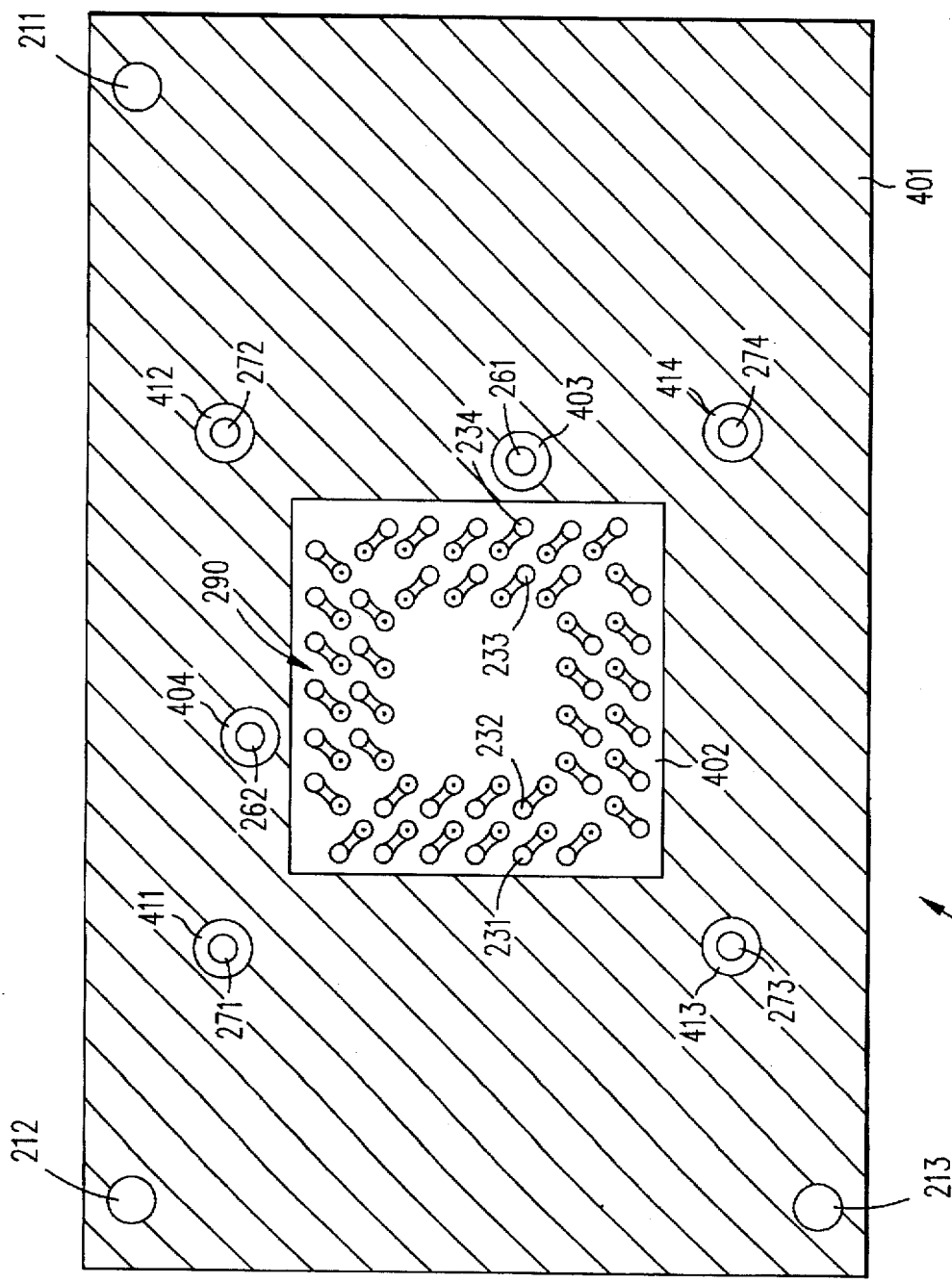
FIG. 10 is a top view of the printed circuit board of FIG. 8 after application of a solder mask.

As illustrated in FIG. 10, a solder mask 401 is formed over the upper surface of the resulting PCB structure. Openings 402–404 and 411–414 in solder mask 401 are formed using a conventional liquid photo-imagible or screened-on solder mask process. Openings 402, 403 and 404 expose array 290, first socket peg fiducial 261 and second socket peg fiducial 262, respectively. Openings 411, 412, 413 and 414 expose heat sink fiducials 271, 272, 273 and 274, respectively. Each of openings 403–404 and 411–414 has a diameter of approximately 128 mils.

A relatively sharp optical contrast exists between the gold-plated upper surface of fiducials 261–262 and the surrounding area within openings 403 and 404. A similar contrast exists between the gold plated upper surfaces of fiducials 271–274 and the surrounding areas within openings 411–414. This contrast exists, in part, because of the relatively high optical reflectivity of the upper surfaces of fiducials 261–262 and 271–274.

An optically-aligned drill, such as Dynamotion Drill with 'Smart Drill' option, available from Dynamotion/ATA, Santa Ana, Calif., is then positioned over PCB 210. This drill includes an optical system which can be focused on a small surface area. The drill is positioned over PCB 210 such that the optical system is focused on first socket peg fiducial 261. Once the optical system has been focused on fiducial 261, the bit of the drill is precisely aligned with this fiducial 261. The drill bit is actuated and lowered, thereby forming a first socket peg hole through PCB 210. The contrast between socket peg fiducial 261 and the surrounding area within opening 403 allows the optical system of the drill to be easily and accurately focused on fiducial 261. The diameter of first socket peg fiducial 261 is selected to optimize the focusing and drilling operation.

This process is repeated, with the optically-aligned drill being focused on second socket peg fiducial 262 and heat sink fiducials 271–274. In the described embodiment, each of the holes drilled through fiducials 261–262 and 271–274 has a diameter of approximately 63 mils.

Figure 11:
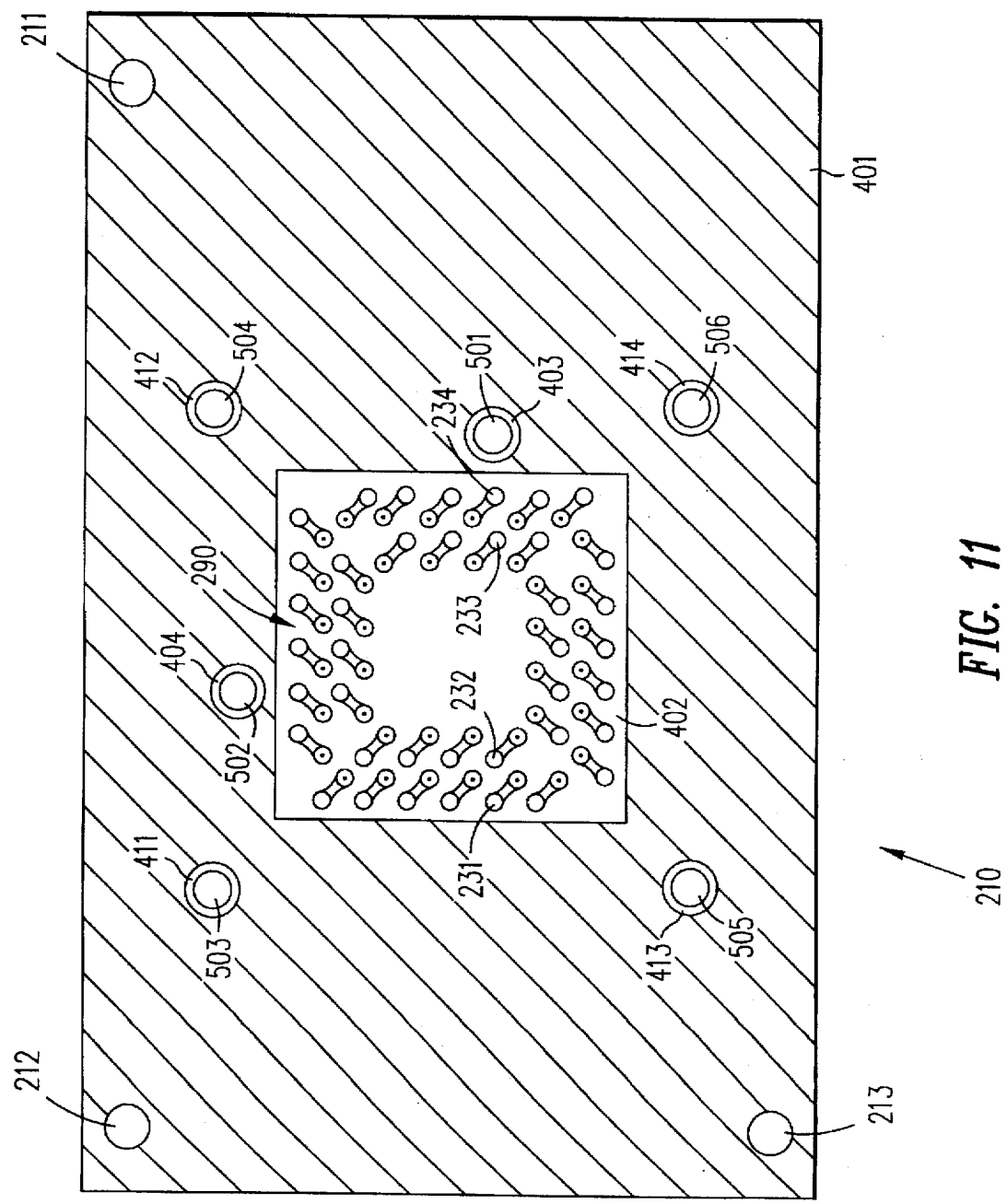
FIG. 11 is a top view of the printed circuit board of FIG. 10 after holes have been drilled.

FIG. 11 illustrates PCB 210 after first and second socket peg holes 501 and 502 have been drilled through socket peg fiducials 261 and 262, and heat sink holes 503–506 have been drilled through heat sink fiducials 271–274. In an alternative embodiment, heat sink holes 503–506 are drilled using a conventional numerically controlled drill, thereby eliminating the need for heat sink fiducials 271–274.

The tolerance $T_{PAD-PEG\ HOLE}$ in the location of first and second socket peg holes 501 and 502, with respect to the location of pads of array 290 is greatly reduced in comparison with the tolerance $T_{PAD-PEG\ HOLE}$ which results when socket peg holes are formed by a conventional numerically controlled drill. This is because the tolerance $T_{PAD-PEG\ HOLE}$ in the present invention is defined by only the following two tolerances: (1) the feature-to-feature tolerance of the photolithographic process used to form the pads and the socket peg fiducials ($T_{PHOTO}$), and (2) the tolerance of the optically aligned drill in creating the socket peg holes 501 and 502 relative to the socket peg fiducials 261 and 262 ($T_{DRILL}$). The tolerance $T_{PAD-PEG\ HOLE}$ is equal to the tolerance $T_{PHOTO}$ plus the tolerance $T_{DRILL}$. In the described embodiment, the tolerance $T_{PAD-PEG\ HOLE}$ is approximately +/–1.2 mils. This is much less than the conventional tolerance $T_{PAD-PEG\ HOLE}$ of approximately +/–4 mils.

Figure 12:
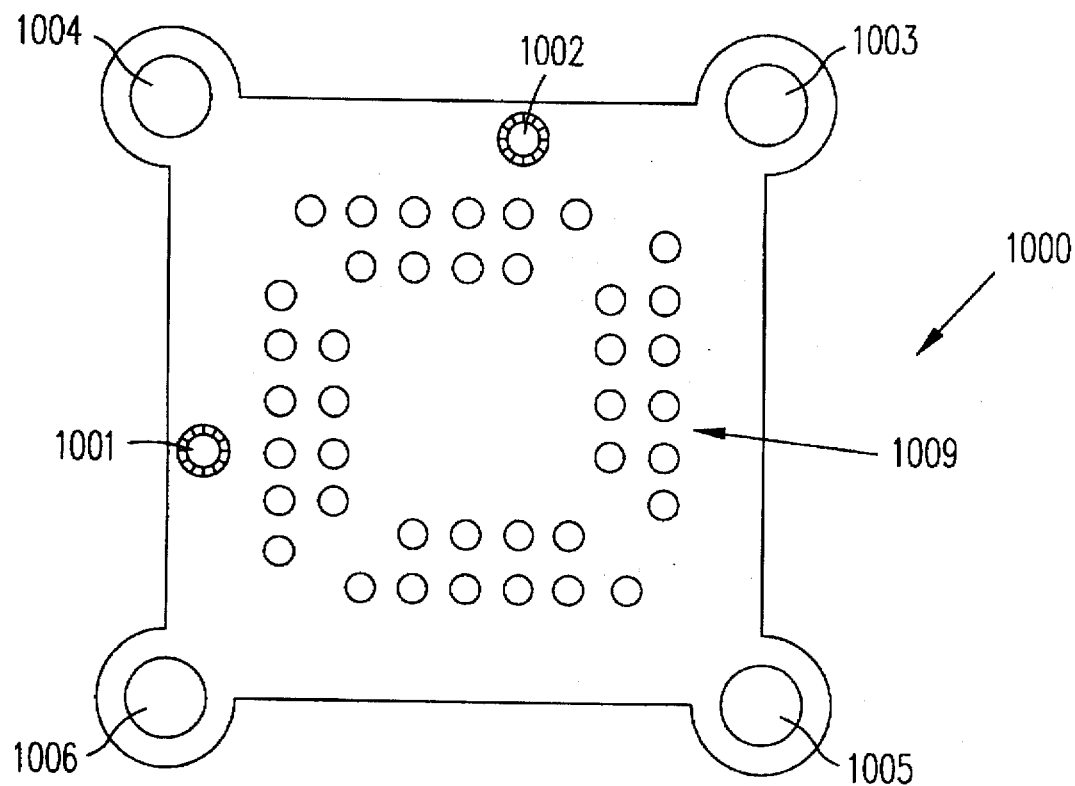
FIG. 12 is a bottom view of a socket which includes socket pegs, heat sink openings, and an array of chamfered button pad openings.
Figure 13:
FIG. 13 is a front view of the socket of FIG. 12.

FIG. 12 is a bottom view of a socket 1000 which includes ribbed socket pegs 1001 and 1002, heat sink openings 1003–1006 and an array 1009 of chamfered button pad openings. FIG. 13 is a front view of socket 1000 which clearly illustrates ribbed socket pegs 1001 and 1002. Socket pegs 1001 and 1002 are located on socket 1000 such that these pegs 1001, 1002 can be inserted into corresponding socket peg holes 501 and 502 in PCB 210. Each of socket pegs 1001–1002 has an outer diameter (including ribs) of approximately 70 mils, and an inner diameter (excluding ribs) of approximately 60 mils. Thus, socket pegs 1001 and 1002 are dimensioned to fit snugly within corresponding socket peg holes 501 and 502. The button pad openings of array 1009 are located such that when socket pegs 1001 and 1002 have been fitted into socket peg holes 501 and 502, each of the button pad openings of array 1009 is aligned with a corresponding button pad of array 290 on PCB 210. Electrically conductive elastomeric connectors (i.e., fuzz buttons) are inserted into the button pad openings of array 1009 to contact the button pads of button pad array 290. Heat sink holes 1003–1006 of socket 1000 are located for alignment with heat sink holes 503–506 of PCB 210 when socket pegs 1001 and 1002 have been inserted into socket peg holes 501 and 502.

Figure 14:
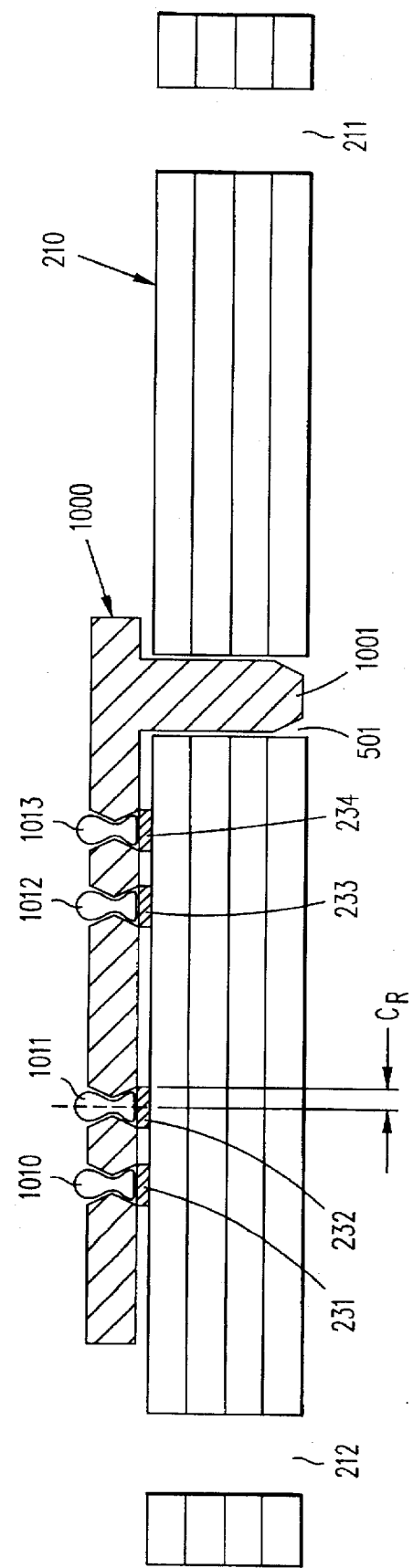
FIG. 14 is a cross sectional view of the printed circuit board of FIG. 11 connected to the socket of FIGS. 12 and 13.

FIG. 14 is a cross sectional view of PCB 210 and socket 1000 after these elements have been connected. Electrically conductive fuzz buttons 1010–1013 have been inserted into the chamfered button pad openings of array 1009. Fuzz buttons 1010–1013 are slightly compressed (deformed) when socket 1000 is connected to PCB 210. Fuzz buttons 1010–1013 contact corresponding button pads 231–234.

Each of the fuzz buttons 1010–1013 remains contained within its associated chamfered opening. The diameter of the chamfered openings at the lower surface of socket 1000 therefore limits the diameter of each of fuzz buttons 1010–1013. The diameter of each chamfered opening is equal to twice the chamfer radius $C_R$ of the chamfered opening. The maximum allowable chamfer radius $C_R$ for a reliable connection between fuzz buttons 1010–1013 and button pads 231–234 is defined by the following equation:

$$C_R = P_{VB} - D_{VP}/2 - AG - T_{PAD\text{-}PEG\ HOLE} - T_{SH} - T_S$$

where AG is the minimum allowable air gap between each fuzz button and its closest adjacent via pad, $T_{SH}$ is the tolerance of the center-to-center misalignment of socket pegs 1001 and 1002 within socket peg holes 501 and 502, and $T_S$ is the tolerance of the misalignment of any fuzz button relative to socket pegs 1001 and 1002. $P_{VB}$, $D_{VP}$ and $T_{PAD\text{-}PEG\ HOLE}$ have previously been described. In the described embodiment, $P_{VB}$ is 27.8 mils, $D_{VP}/2$ is 11.5 mils, AG is 1.0 mil, $T_{PAD\text{-}PEG\ HOLE}$ is 1.4 mils, $T_{SH}$ is 0.5 mils, and $T_S$ is +/−1.5 mils, resulting in a maximum chamfer radius $C_R$ of 11.9 mils. Reducing the tolerance $T_{PAD\text{-}PEG\ HOLE}$ by approximately 2.6 mils, (i.e., from +/−4.0 mils to +/−1.4 mils) produces one or both of the following effects. First, the maximum chamfer radius $C_R$ can be increased by up to 2.6 mils for similar values of ($P_{VB} - D_{VP}$). Alternatively, the pitch $P_{VB}$ and the via pad diameter $D_{VP}$ can be varied such that the difference ($P_{VB} - D_{VP}$) is reduced by up to 2.6 mils for similar values of $C_R$. Reducing the difference ($P_{VB} - D_{VP}$) allows $P_{VB}$ to be made smaller and/or $D_{VP}$ to be made larger, thereby increasing the packing density of the pads.

Figure 15:
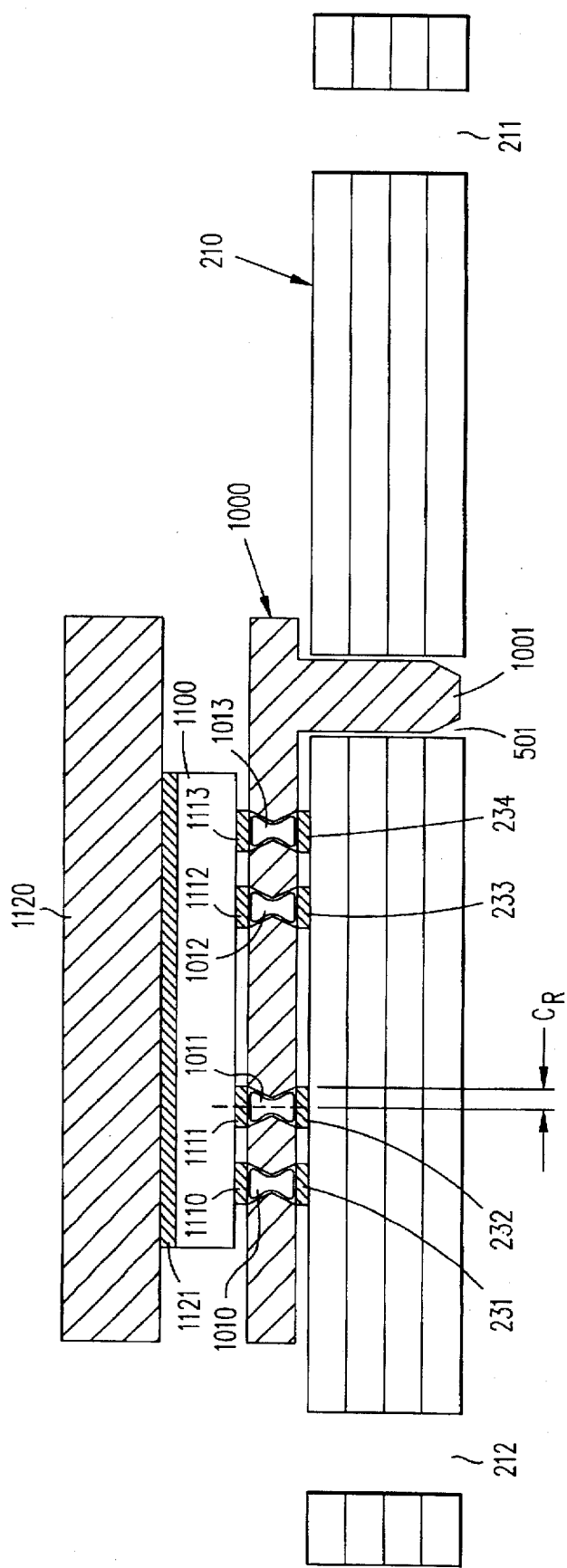
FIG. 15 is a cross sectional view which illustrates a semiconductor chip and a heat sink coupled to the structure of FIG. 14.

FIG. 15 is a cross sectional view of PCB 210 and socket 1000 after a semiconductor chip 1100 is located on socket 1000. Pads 1110–1103 on the lower surface of chip 1100 contact corresponding fuzz buttons 1010–1013. As a result, chip 1100 is electrically connected to PCB 210. A heat sink 1120 is connected to chip 1100 with a thermally conductive adhesive 1121. Heat sink 1120 is also secured to PCB 210 by four fasteners (not shown). Each of these four fasteners (e.g., screws) extends through a corresponding one of heat sink holes 503–506 in PCB 210 and a corresponding one of heat sink holes 1003–1006 in socket 1000. Each fastener is connected to heat sink 1120 at one end, and to the underside of PCB 210 at the other end.

Although the invention has been described in connection with several embodiments, it is understood that this invention is not limited to the embodiments disclosed, but is capable of various modifications which would be apparent to one of ordinary skill in the art. For example, although the present invention was described using an embodiment having only forty button pads, it is understood that other numbers of pads can be used in accordance with the invention. Additionally, the invention is applicable to pads having different pitches and/or diameters. Moreover, the invention is applicable to pads having different shapes, such as square or rectangular. Thus, the invention is limited only by the following claims.

What is claimed is:

1. A method of locating a socket on a printed circuit board, the method comprising the steps of:
   fabricating a plurality of pads over an upper surface of the printed circuit board;
   fabricating a fiducial over the upper surface of the printed circuit board;
   optically aligning a drill with the fiducial; and then
   drilling a socket hole through the fiducial and the printed circuit board.

2. The method of claim 1, further comprising the step of locating a peg of the socket in the socket hole.

3. The method of claim 1, wherein the pads and the fiducial are fabricated at the same time.

4. The method of claim 1, wherein the fiducial is located immediately adjacent to the pads.

5. The method of claim 1, wherein the pads and the fiducial are plated over the upper surface of the printed circuit board.

6. The method of claim 1, further comprising the step of plating a conductive material over an upper surface of the pads and the fiducial.

7. The method of claim 6, wherein the conductive material comprises gold.

8. The method of claim 1, further comprising the steps of:
   forming a solder mask layer over the pads and the fiducial; and
   forming openings in the solder mask layer to expose the pads and fiducial.

9. The method of claim 1, wherein the steps of fabricating the pads and the fiducial comprise the steps of:
   forming a conductive layer over the upper surface of the printed circuit board;
   forming a master tooling hole through the printed circuit board;
   forming a photoresist layer over the conductive layer;
   locating a reticle over the photoresist layer in alignment with the master tooling hole, wherein the reticle defines locations of the pads and the fiducial;
   exposing the photoresist layer through the reticle;
   developing the photoresist layer, thereby exposing portions of the conductive layer where the pads and the fiducial are to be formed;
   plating conductive features on the exposed portions of the conductive layer;
   plating etch resist features over the conductive features;
   removing the photoresist layer; and
   removing the conductive layer where the conductive layer is not covered by the etch resist features.

10. The method of claim 1, further comprising the step of:
    providing a plurality of openings in the socket corresponding to the pads on the printed circuit board; and
    providing electrically conductive connectors in the openings, wherein the connectors contact the pads when the socket is located on the printed circuit board.

11. A method for locating holes on a printed circuit board, the method comprising the steps of:

forming a master tooling hole through the printed circuit board;

locating a fiducial on the printed circuit board, wherein master tooling hole is used as a guide for locating the fiducial, the fiducial being of a material which provides an optical contrast with an area surrounding the fiducial;

focusing on the fiducial with an optically alignable drill, whereby the drill is aligned with the fiducial; and then drilling a hole through the fiducial and the printed circuit board with the aligned drill.

12. The method of claim 11, further comprising the step of locating a plurality of pads on the printed circuit board at the same time that the fiducial is located on the printed circuit board.

13. The method of claim 12, wherein the pads are located immediately adjacent to the fiducial.

14. The method of claim 12, wherein the pads and the fiducial are plated over the upper surface of the printed circuit board.

15. The method of claim 11, further comprising the step of plating a reflective material on the upper surface of the fiducial.

16. The method of claim 11, further comprising the steps of:

forming a solder mask layer over the fiducial; and forming an opening in the solder mask layer to expose the fiducial.

* * * * *